(12) United States Patent
Fujimori

(10) Patent No.: US 7,158,488 B2
(45) Date of Patent: Jan. 2, 2007

(54) COMMUNICATION CONTROL APPARATUS AND METHOD

(75) Inventor: Junichi Fujimori, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 912 days.

(21) Appl. No.: 10/050,730

(22) Filed: Oct. 26, 2001

(65) Prior Publication Data

US 2002/0080783 A1    Jun. 27, 2002

(30) Foreign Application Priority Data

Oct. 31, 2000    (JP)    ............... 2000-333656

(51) Int. Cl.
*H04J 3/24*    (2006.01)
*H04J 3/06*    (2006.01)
*H04B 7/212*    (2006.01)
*H04L 12/28*    (2006.01)

(52) U.S. Cl. ............... 370/312; 370/324; 370/350; 370/503

(58) Field of Classification Search ............... None
See application file for complete search history.

(56) References Cited

U.S. PATENT DOCUMENTS

| 5,355,371 | A | * | 10/1994 | Auerbach et al. ............... 370/255 |
| 5,483,522 | A | * | 1/1996 | Derby et al. ............... 370/400 |
| 5,579,482 | A | | 11/1996 | Einkauf et al. |
| 5,867,497 | A | | 2/1999 | Fujimori et al. |
| 6,028,866 | A | * | 2/2000 | Engel et al. ............... 370/461 |
| 6,085,238 | A | | 7/2000 | Yuasa |
| 6,377,575 | B1 | * | 4/2002 | Mullaney et al. ............... 370/360 |

FOREIGN PATENT DOCUMENTS

| DE | 43 21 304 A1 | 3/1995 |
| EP | 0 767562 | 4/1997 |
| JP | 07-297824 | 11/1995 |
| JP | 09-298558 | 11/1997 |
| JP | 10-190736 | 7/1998 |
| JP | 11-008643 | 1/1999 |
| JP | 11-196028 | 7/1999 |
| JP | 11-196029 | 7/1999 |
| JP | 2000-078170 | 3/2000 |
| JP | 2001-094627 | 4/2001 |
| WO | WO 00/56016 | 9/2000 |

* cited by examiner

*Primary Examiner*—Chau Nguyen
*Assistant Examiner*—Cynthia L. Davis
(74) *Attorney, Agent, or Firm*—Morrison & Foerster LLP

(57) ABSTRACT

One or more nodes on a communication network are selected and set as one node group. In each of the nodes, group identification information representing the node group to which the node belongs is stored in advance. The group identification information is attached to the header of a data packet to be transmitted, so that nodes constituting a node group that should commonly receive data can be readily identified by comparing the group identification information imparted to the transmitted data packet and the group identification information stored in each receiving node. Given node can choose to become a node of a particular function, such as a clock master node, in which case control is performed to delete, from the node group, a node having so far played the role of the node of the particular function in such a manner that there exists only one node of the particular function per node group.

10 Claims, 6 Drawing Sheets

COMMUNICATION CONTROL APPARATUS AND METHOD

BACKGROUND OF THE INVENTION

The present invention relates generally to a technique for communicating data containing tone-related signals, such as music performance data like audio data or MIDI data, between a plurality of nodes via a communication network, and more particularly to an improved communication control apparatus and method for use in such data communication.

In recent years, audio/video systems are built by interconnecting many electronic devices, such as a video display device, video tape recorder, audio components and karaoke device. In the field of electronic musical instruments, an ensemble performance system or the like are built by interconnecting a plurality of electronic musical instruments or interconnecting a sequencer, personal computer and the like using a unified standard, such as the well-known MIDI (Musical Instrument Digital Interface) standard. Techniques for communicating tone-related signals between a plurality of nodes interconnected via a communication network are known, for example, from Japanese Patent Laid-open Publication Nos. 9-298558, 10-190736, 2000-78170 and 2001-94627 and U.S. Pat. No. 5,867,497. In the case of nodes handling tone-related signals, they receive synchronization signals from a clock master node so that synchronization is achieved, on the basis of the synchronization signals, between the nodes in reproducing the tone signals. Namely, to allow one of a plurality of nodes to read out and transmit audio waveform signals and another node to receive the audio waveform signals from the one node and perform various processes, such as audio waveform reproduction, based on the received signals while keeping synchronization among the plurality of nodes, there is provided, on a communication network, a word clock master node, which transmits a reference time stamp to each of the nodes (slave nodes) every predetermined cycle. Thus, of the slave nodes, a transmitting node reads out an audio waveform signal, on the basis of the reference time stamp, from the clock master node and generates a transmission time stamp indicative of a transmission time, so as to transmit, to the communication network, audio data along with the thus-generated transmission time stamp. Receiving node also performs real-time audio data reproduction, on the basis of the time stamp and audio data transmitted from the transmitting node, in synchronism with the reference time stamp. In this manner, real-time synchronism is achieved among the plurality of networked devices (nodes).

Further, as means for building a communication network interconnecting a plurality of electronic musical instruments for tone/audio/video processing, there have recently been employed digital serial communication schemes that are based on the IEEE 1394 standard or USB (Universal Serial Bus) standard. With a high-speed communication networking technique based on the IEEE 1394 standard or USB standard, it is possible to interconnect a multiplicity of nodes requiring real-time processing and thereby build a large-scale and complicated communication network. In such communication schemes based on the IEEE 1394 standard or USB standard, a single signal path is used to connect between nodes to form a communication network having a daisy chain or tree configuration. Header is attached to data to be transmitted on the communication network, and the header includes information indicative of a particular node which should receive the data. Any one of the nodes, if it is determined that the header of the data transferred on the communication network has been addressed to that node, takes in and processes the data in question. Further, when a given node transmits data to another node, the given node transfers the data to the network after imparting, to the header of the data, information indicative of a particular node which should receive the data.

However, in the case where the IEEE 1394 standard or USB standard is employed, tone-related signals, control signals and various other signals pertaining to the networked devices are transferred over the single signal path and the individual nodes (individual networked devices) are connected with one another via the single signal path, so that it is almost impossible to readily know or ascertain which nodes (networked devices) are connected with which nodes (networked devices) for data communication (actual data transmitting/receiving relationships among the nodes) or what kind of data are being transmitted/received or communicated among the nodes. For example, merely checking current settings in one particular node can not tell whether any other node has been set to designate the particular node, and it is eventually necessary to check respective current functional settings in all the nodes. But, because the daisy chain with the nodes linked together via the single signal path may be expanded infinitely, it is not at all advisable to check the current functional settings in all the nodes on the communication network.

Further, in a situation where a real-time ensemble performance is to be executed by a plurality of nodes, to change the word clock master node (that provides a synchronization basis for communication of tone-related signals between the nodes via the communication network) from one master node having a given clock frequency over to another master node having another clock frequency, the settings about the word clock master node must be changed in each of the slave nodes, which would require very laborious and time-consuming operations.

SUMMARY OF THE INVENTION

It is therefore an object of the present invention to provide a communication control apparatus and method which can facilitate identification of actual connecting states between a plurality of networked nodes.

It is another object of the present invention to provide a communication control apparatus and method which allow actual connecting states between a plurality of networked nodes to be readily set and changed.

It is still another object of the present invention to provide a communication control apparatus and method which can facilitate an operation for changing a node to which a particular function, such as a word clock master node.

According to an aspect of the present invention, there is provided a communication control apparatus which comprises: a group setting section that selects one or more nodes from among a plurality of nodes connected to a communication network and classifies the selected nodes as one node group; and a registration section that, in association with each of the nodes classified as the one node, registers group identification information for identifying the node group. The group identification information can be used to identify nodes constituting a node group that should at least commonly receive data.

With such arrangements, just checking the group identification information of each of the nodes can ascertain which nodes are actually connected with which nodes (actual data communicating relationships between the nodes) and hence can identify actual states of connection among the nodes. Further, by just changing a node group, to which a given node belongs, to another node group, it is possible to establish connection with all nodes present in the other node group. As a result, the present invention can readily set actual connecting states between a plurality of nodes and change contents of the thus-set connecting states as necessary.

According another aspect of the present invention, there is provided a communication control apparatus which comprises: a classification section that classifies a plurality of nodes connected to the communication network into any of one or a plurality of node groups; a selector that selects a given node as a node of a particular function; and a control section that performs control such that there exists only one node of the particular function per node group.

By performing control such that only one node of a particular function, such as a word clock master node, exists in one node group, the present invention can readily change settings about the nodes, such as one for changing the node of the particular function from one node over to another. For example, the node of the particular function can be appropriately changed from one node over to another, without having to rearrange the classification of the nodes into node groups. Thus, with the present invention, the setting about the node of the particular function, such as a word clock master node, can be changed with ease.

The present invention may be constructed and implemented not only as the apparatus invention as discussed above but also as a method invention. Also, the present invention may be arranged and implemented as a software program for execution by a processor such as a computer or DSP, as well as a storage medium storing such a program. Further, the processor used in the present invention may comprise a dedicated processor with dedicated logic built in hardware, not to mention a computer or other general-purpose type processor capable of running a desired software program.

While the described embodiments represent the preferred form of the present invention, it is to be understood that various modifications will occur to those skilled in the art without departing from the spirit of the invention. The scope of the present invention is therefore to be determined solely by the appended claims.

BRIEF DESCRIPTION OF THE DRAWINGS

For better understanding of the object and other features of the present invention, its embodiments will be described in greater detail hereinbelow with reference to the accompanying drawings, in which.

DETAILED DESCRIPTION OF THE INVENTION

Figure 1:
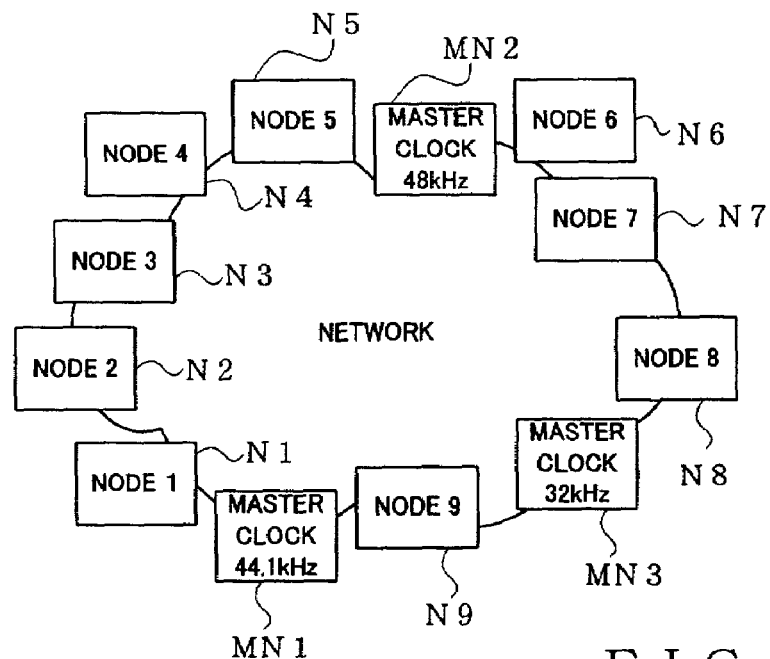
FIG. 1 is a block diagram showing an exemplary general setup of a communication network built by interconnecting a plurality of nodes.

Before going into detailed description of the invention based on the drawings, some key features of the embodiments to be later detailed will first be explained briefly.

Communication control apparatus in accordance with en embodiment of the present invention comprises: a group setting section that selects one or more nodes from among a plurality of nodes connected to a communication network and classifies the selected nodes as one node group; and a registration section that, in association with each of the nodes classified as the one node, registers group identification information for identifying the node group. In this apparatus, nodes constituting a same node group that should at least commonly receive data can be identified by the group identification information.

As one example, the group setting section may be arranged to select a plurality of nodes and establishes a new node group composed of the selected nodes. As another example, the group setting section may perform selection operation to change an organization of nodes in a node group selected from among one or more node groups existing on the communication network. As still another example, the communication control apparatus is included in a given node connected to the communication network, and the group setting section may select, from among one or more node groups existing on the communication network, a node group to which the given node should belong, in which case the registration section may include a memory for storing the group identification information in the given node.

Each of the nodes on the communication network corresponds, for example, to one musical instrument. Each of the nodes, i.e. each of the musical instruments, on the communication network includes a plurality of types of data-inputting or data outputting plugs, rather than just one type of data-inputting or data outputting plug, such as "audio input", "audio output", "MIDI input" and "MIDI output" plugs. In this case, setting or establishment of a node group in accordance with the present invention may be performed either for each of the plug types or for each of specific plugs belonging to the plug types. Namely, the node group establishment in accordance with the present invention can be performed such that, even for a same node, each of the plug types or each of the specific plugs is classified or grouped into any one of a plurality of node groups; that is, even for the same node, the plug types or the specific plugs may be classified into different node groups.

The group identification information is imparted to data to be transmitted via the communication network. In this way, the data can be transmitted/received (communicated) between a plurality of nodes of a same node group, using the group identification information.

In another embodiment, the communication control apparatus is designed as an apparatus for inclusion in a given node to be connected to a communication network, a plurality of nodes to be connected to the communication network being classified into any of one or a plurality of node groups, which apparatus comprises: a storage section storing group identification information of a node group to which the given node belongs; and a transmitter that, when data is to be transmitted to the communication network, transmits the data with group identification information imparted to the data.

In still another embodiment, the communication control apparatus is designed as an apparatus for inclusion in a given node to be connected to a communication network, a plurality of nodes to be connected to the communication network being classified into any of one or a plurality of node groups, which apparatus comprises: a storage section storing group identification information of a node group to which the given node belongs; and a receiver that receives data via the communication network, data to be transmitted via the communication network being imparted with group identification information indicative of a node group to which a node to receive the data belongs to, the receiver receiving the data on condition that the group identification information imparted to the data transmitted via the communication network matches with the group identification information, of the node group to which the given node belongs, stored in the storage section.

In still another embodiment, the communication control apparatus is designed as an apparatus for inclusion in a given node connected to a communication network in an environment in which a plurality of nodes connected to the communication network are classified into any of one or more of node groups, which apparatus comprises: a selector that selects the given node as a node of a particular function; and a control section that, when the given node is selected via the selector as the node of the particular function, cancels the particular function having so far been allocated to another node in such a manner that only one node of the particular function exists in a node group to which the given node belongs. With the arrangements, the node of the particular function can be appropriately changed from one node over to another, and the setting about the node of the particular function, such as a word clock master node, can be changed with ease. For example, the node of the particular function can be appropriately changed from one node to another, without having to reclassify the nodes into node groups.

In still another embodiment, the communication control apparatus is designed as an apparatus for inclusion in a given node to be connected to a communication network, which apparatus comprises: a selector that selects the given node as a node of a particular function; and a control section that, when the given node is selected via the selector as the node of the particular function, controls the given node to communicate with another node on the communication network using, as identification information of the given node, a predetermined name representative of the particular function. In this case, when another node performs data transmission/reception (communication) with the node of the particular function, it is not necessary to ascertain which of the nodes on the communication network is exactly the node of the particular function; it just suffices to identify the node of the particular function, using the predetermined name. Thus, even when a changeover has taken place in the node of the particular function, the other node always only has to identify the node of the particular function using the predetermined name. As a result, the present invention allows the setting about the node of the particular function, such as a word clock master node, to be changed with increased ease.

In still another embodiment, the communication control apparatus is designed as an apparatus for inclusion in a given node to be connected to a communication network, which apparatus comprises a control section that, when communication is to be performed between the given node and another node of a particular function via the communication network, performs control such that the given node communicates with the other node after the given node identifies a node possessing a predetermined name representative of the particular function to be the node of the particular function. In this case too, when another node performs data transmission/reception with the node of the particular function, it is not necessary to ascertain which of the nodes on the communication network is exactly the node of the particular function; it just suffices to identify the node of the particular function, using the predetermined name. Thus, the present invention allows the setting about the node of the particular function, such as a word clock master node, to be changed with increased ease.

Next, the embodiments of the present invention will be described in more details with reference to the accompanying drawings.

First, an exemplary general organization of a communication network employed in the present invention will be outlined, although it is known in the art per se and does not constitute part of the invention. FIG. 1 is a block diagram showing a communication network composed of a plurality of nodes N1–N9 and MN1–MN3. In this communication network, data are transferred by a digital serial packet transfer scheme conforming to a predetermined standard, such as the IEEE 1394 or USB standard. For example, the nodes N1–N9 and MN1–MN3 are audio/video (AV) electronic devices such as audio components and karaoke device, or electronic devices related to electronic musical instruments such as a keyboard, other types of electronic musical instruments, sequencer and personal computer. On this communication network, there are transferred tone signals like audio waveform signals, tone performance data like MIDI data, and tone control signals (these signals and data will hereinafter be collective called "tone-related signals"). Note that the signals transferred on the communication network are not limited to such tone-related signals, and they may include image data, text data and other desired digital data. On the same communication network, there may be provided one or mode nodes having nothing to do with tone-related signals. The nodes represented by reference characters MN1–MN3 are each a word clock master node that has a function of generating a reference time stamp in accordance with a predetermined clock frequency such as 44.1 kHz or 48 kHz. The nodes represented by reference characters N1–N9 are slave nodes subordinate to the master nodes MN1–MN3. Any one of the slave nodes N1–N9 can be converted to a master node in response to selecting operation by a human operator, as long as it has a master clock generating function. Further, any one of the master nodes MN1–MN3 can have other necessary functions than the master clock generating function, such as a tone generating function and performance data generating function.

As well-known in the art, the IEEE 1394 or USB standard permits signal exchange among all the nodes on the communication network by just interconnecting the nodes (networked devices) by a single signal path (serial bus). Of course, the communication network may be built into any other configuration than the daisy chain as illustrated in FIG. 1, such as a tree configuration with hubs interposed between signal paths at individual levels. Further, as any one of the nodes on the communication network in question is connected to another communication network, the other nodes on the communication network in question is automatically connected to the other communication network.

Figure 2:
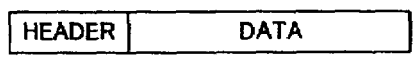
FIG. 2 is a diagram schematically showing a data packet transferred on the communication network.

In FIG. 2, there is outlined a data packet format of signals transferred on the communication network. As shown, each data packet is composed of a header and a substantive data portion. Conventionally, the header includes an ID of a transmitting node (transmitting-node identification information) necessary for communication, time stamp, information indicative of a type of the data, plug ID (plug identification information) and other pieces of information. Importantly, the header employed in the instant embodiment of the present invention includes, in addition to the above-mentioned, group identification information as will be later described in detail. Each of the networked nodes (i.e., nodes connected to the communication network) determines whether data input to its input port from the bus is to be handled or processed by that node and, if so, takes in and proceeds to process the taken-in data. The data input to the input port from the bus can be immediately forwarded to another node by being passed from an output port of the node to the bus. Each of the networked nodes makes the determination as to whether or not the input data is to be processed by that node, on the basis of the header imparted to the data. For example, it is conventional that each of the networked devices has preset therein data reception conditions as to which plug of which node data should be received from; namely, each of the nodes identifies data to be received, on the basis of the header. In the embodiment of the present invention, it is possible not only to set data reception conditions similar to those employed in the conventional technique but also to control the data reception in consideration of the above-mentioned group identification information, as will be later described.

Figure 3:
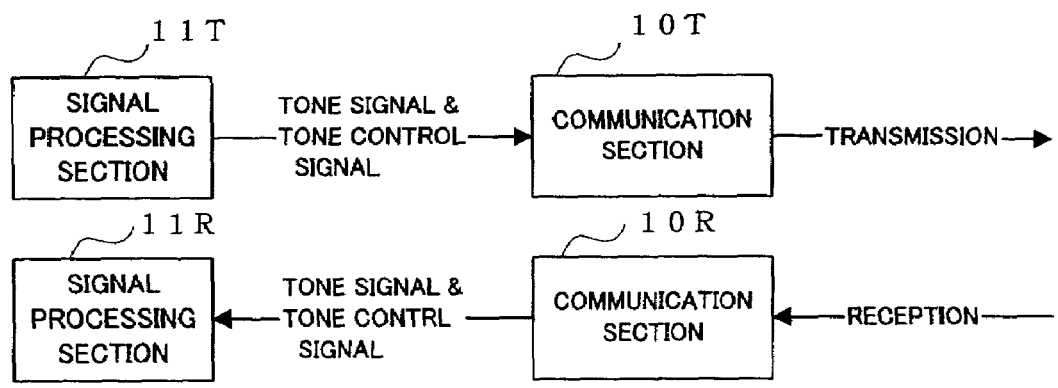
FIG. 3 is a block diagram outlining processing performed in each of the networked nodes of FIG. 1.

FIG. 3 is a diagram outlining processing functions of each of the networked nodes of FIG. 1. Broadly, the node has functions of communication sections 10R and 10T, and functions of signal processing sections 11R and 11T. The receiving communication section R reads the header of a data packet received from the serial bus via the input port and takes in the data if it is determined that the data is one to be received by that node. Then, the communication section R depackets the taken-in data, identifies the input plug of the node on the basis of the plug ID of the transmitting node, and passes the substantive data portion of the depacketed data to the signal processing section 11R in association with the identified input plug. In turn, the signal processing section 11R takes in the substantive data portion of the data in association with the identified input plug and subjects the taken-in data to a predetermined process corresponding to the input plug. The other or transmitting signal processing section 11T prepares data to be transmitted to another node. Specifically, the transmitting communication section 10T creates a data packet by imparting a header to the prepared data and transmits the created data packet to the serial bus via the output port. The header includes a transmitting node ID indicative of the transmitting node and a plug ID indicative of the output plug of the data prepared by the transmitting signal processing section 11T. If the data to be transmitted is a tone signal (audio waveform signal) or tone control signal (MIDI data) that should be imparted with time information, a time stamp indicative of a current time is added to the header.

Figure 4:
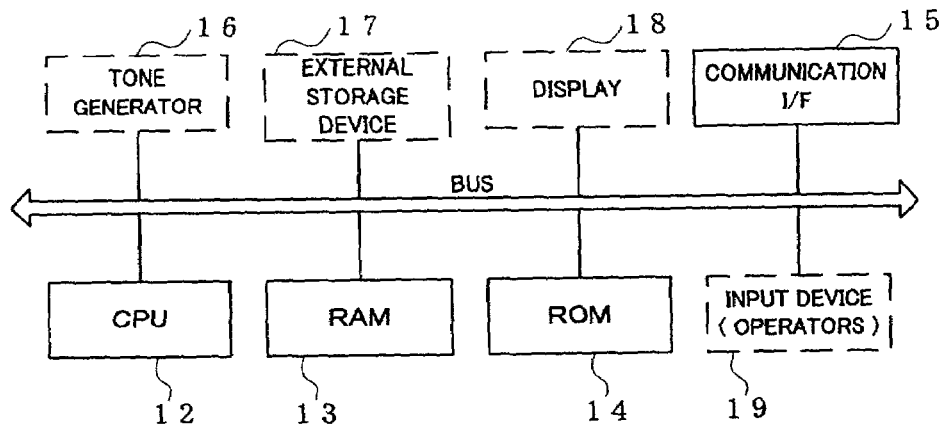
FIG. 4 is a block diagram showing an exemplary hardware setup of each of the nodes of FIG. 1.

FIG. 4 is a block diagram showing an exemplary general hardware setup of each of the nodes of FIG. 1. Minimum necessary hardware components of the node are a computer or microcomputer including a CPU 12, a RAM 13 and a ROM 14, and a communication interface 15 conforming with the standard of the network. It should be appreciated that the node includes, in accordance with the node-specific functions, necessary electronic components, such as a tone generator 16, an external storage device 17, a display device 18 and an input device (operation panel) 19.

Figure 5:
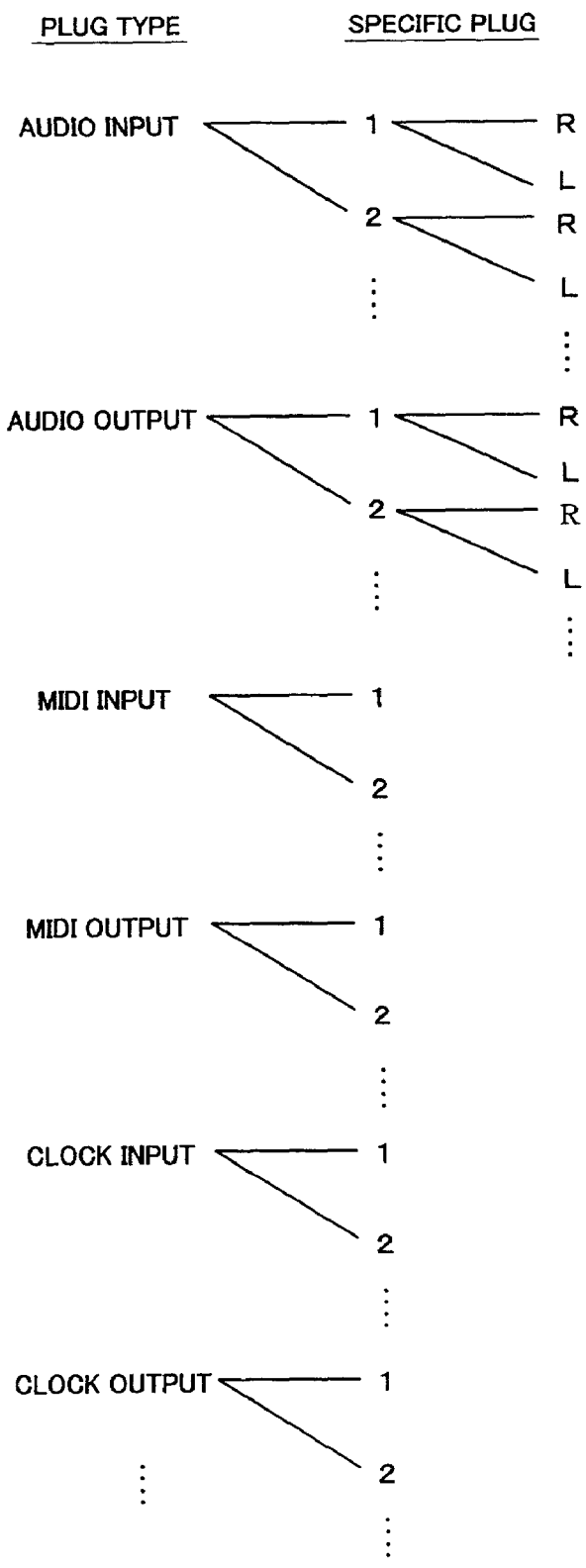
FIG. 5 is a diagram showing examples of plug types and specific plugs belonging to the plug types in one of the nodes.

As known in the art, the "plug" represents a terminal for connecting one device with another, and various types of plugs are used for individual devices. Examples of such plugs are shown in FIG. 5, which include types of plugs "audio input", "audio output", "MIDI input", "MIDI output","clock input" and "clock output". Some of the plug types may each include a plurality of specific (sub-type) plugs belonging to the plug type. For example, the "audio input" plug may include a plurality of specific plugs, such as "audio input 1" and "audio input 2", and even the sub-type plug "audio input 1" may include a plurality of specific plugs, such as "R (right) channel" and "L (left) channel". Of course, there may be some type of plug which consists of just one plug with no sub-type plug belonging thereto.

In the traditional typical signal path connection between devices, separate terminals are physically provided in corresponding relation to the plugs, and these terminals are connected with each other via separate wires. With the IEEE 1394 standard or USB standard, however, various signals are transferred over a single signal path (serial bus), and sources and destinations of the individual signals are logically distinguished from each other on the basis of node IDs and plug IDs imparted to the respective headers of packets transferred on the serial bus. Therefore, the number and types of the logical plugs can be increased as desired as long as the header format used permits, but the communication network is placed in a more complicated situation.

Thus, to readily grasp the system setup of such a complicated communication network, the present invention is arranged such that a group setting process is performed in each of the nodes (devices), connectable to the communication network, so that each of the nodes can set which node group the node should belong to. The present invention is also arranged to manage the networked nodes by allowing the user of any one of the nodes to freely name each of the established node groups and change the name of any one of the established node groups. Further, the present invention allows each of the nodes (devices) to store, in a storage section of the node, group identification information (or node group name) identifying the group to which the node belongs (i.e. into which the node is classified). Furthermore, in the present invention, the classification of the nodes into the node groups (grouping), i.e. setting as to which node group the node should belong to, can be performed for each plug type or for each specific plug belonging to the plug type.

Figure 6:
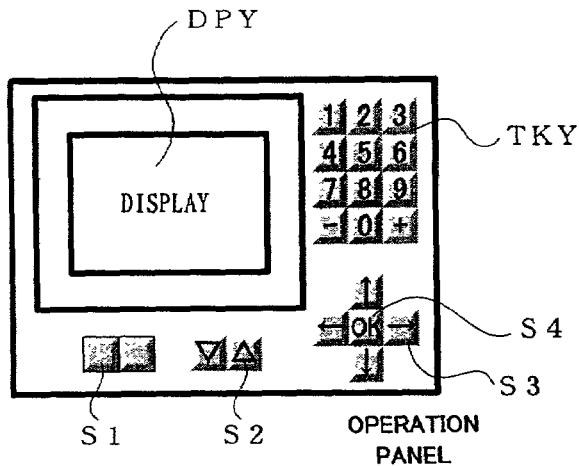
FIG. 6 is a diagram showing an example of an operation panel (input device) employed in one of the nodes.

Now, a description will be made about a group setting process performed in each of the nodes in the instant embodiment. FIG. 6 shows the operation panel (input device 19 of FIG. 4) used in the node for user's operation for the group setting process. The operation panel includes a managing operator S1 operable by the user for managing the communication network; specifically, this managing operator S1 is operated by the user when the group setting process is to be performed or when a clock master node is to be set. Operator S2 is operable for switching a page or screen displayed on a display section DPY in a forward or backward direction. Operator S3 comprises cursor operating keys, which is operable for moving a cursor on the display section DPY in any one of up-and-down and left-and-right directions. Operator S4 is a confirming (OK) key, which is operable for confirming a selection or instruction made by the use of the cursor. Operator TKY is a ten-button keypad, which is operable for entering data. For entry of characters such as those of a group name, the desired characters can be entered by a combination of operation of the ten-button keypad TKY and visual guide display on the display section DPY. Of course, if the node is equipped with a character-inputting keyboard, such a keyboard can be used to enter desired characters such as those of the group name.

Figure 7:
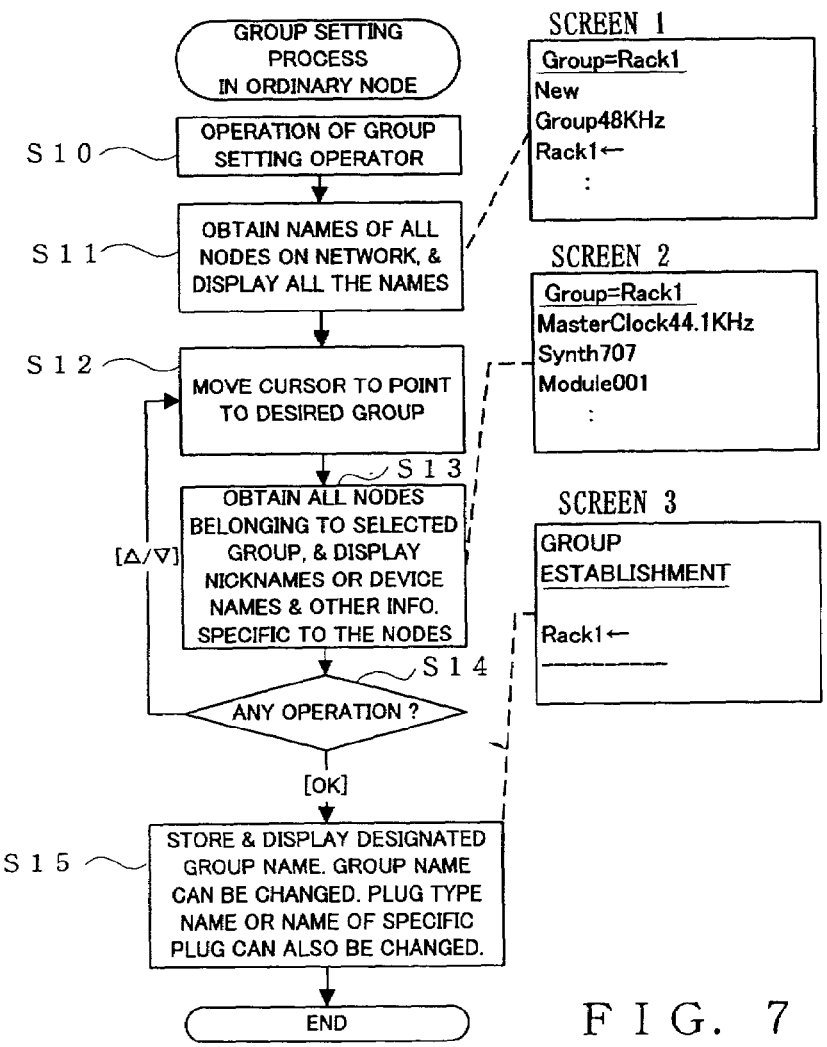
FIG. 7 is a flow chart explanatory of an embodiment of the present invention, which particularly shows an example of a group setting process carried out in one of the nodes.

FIG. 7 is a flow chart showing an exemplary operational sequence of the group setting process capable of being performed by an ordinary node. In this group setting process, the node can carry out operations, such as one for selecting any one of one or more node groups present on the communication network to add the node to the selected node group as a new member of the group, one for changing the node group which it belongs to over to another node group and one for changing the name (or nickname) of the selected node group. Once the user of the node performs group setting operation by use of the managing operator S1, this group setting process is started up at step S10. Then, at step S11, the names of all the node groups currently present on the communication network are obtained, and all of the thus-obtained node group names (a list of node group names) are displayed on the display section DPY. "SCREEN 1" depicted to the right of the block of step S11 shows an example of the list of node group names, among which are "New", "Group48 kHz" and "Rack1". The node group name "New" represents a default node group which includes, as its members, all the slave nodes (i.e., nodes other than the word clock master nodes) on the communication network. Thus, when no group setting operation has been performed by the user, only the default node group name "New" is automatically displayed on the display section DPY. As the group setting/classification operation by the user progresses, each node is made to belong to a node group other than the "New" node group, and thus the number of the nodes belonging to (left in) the "New" node group decreases.

The names of all the node groups currently present on the communication network may be obtained in any desired manner. Because each of the nodes stores, in its storage section, the group identification information (or node group name) of the node group which it belongs to, the group identification information (or node group names) of all the node groups may be acquired by making inquiries to the individual nodes. In an alternative, if the nodes include any particular node capable of performing a managerial function, such as a personal computer, the particular node may store current group setting states within the communication network so that the group identification information (or node group names) of all the node groups may be acquired by inquiring of the particular node about the current group setting states. Alternatively, if the node of the user can store the node group setting states in the communication network, the group identification information (or node group names) of all the node groups can be acquired without inquiring of the communication network about the node group setting states.

Then, at step S12, the cursor is moved on the node group name screen of the display section DPY to select a desired one of the displayed node groups. Left arrow on SCREEN 1 of FIG. 7 represents the cursor, and the node group name pointed to by the cursor is moved to an uppermost position on the screen. In the illustrated example, a node group named "Rack1" is pointed to by the cursor. Then, once the user has performed predetermined selection confirming operation, the selection via the cursor is confirmed. Then, the process proceeds to step S13, where the node names (or node IDs) belonging to the node group selected via the cursor are obtained and displayed on the display section DPY. "SCREEN 2" depicted to the right of the block of step S13 displays an example of the node names belonging to the "Rack1" node group. "MasterClock44.1 kHz", "Synth707", "Module001", etc. are the node names (node nicknames), and "Group=Rack1" at the top of the screen indicates that the node group displayed here is named "Rack1". Although not specifically shown on the example of the screen, the specific names or types of the devices constituting the nodes, such as a keyboard, CD player, video player and sequencer, may be displayed together with the node names. Further, other pieces of information specific to the individual nodes, such as absolute information exactly identifying the nodes rather than their nicknames, may be displayed together with the node names. Particularly, plug types or names of specific plugs may be displayed along with the node names, in the event that what belong to the node group are the particular plug types or names of the specific plugs belonging to the plug types within the nodes, rather than the entire nodes or devices.

At next step S14, a determination is made as to whether the user has performed operation for confirming the node group selection using the confirming (OK) operator S4 on the operation panel. If the user has operated the confirming (OK) operator S4 for this purpose as determined at step S14, the process moves on to step S15. However, if the screen-switching operator S2 has been operated, the process reverts to step S12 in order to allow the user to select another node group on the group list display screen (SCREEN 1). At step S15, the node group name (group identification information), of which the user's selection has been confirmed as above, is stored in a predetermined storage section of the user's node so as to make a registration indicating that the user's node belongs to that node group. Then, the node group name, for which the registration has been confirmed, is displayed on the display section DPY. "SCREEN 3" depicted to the right of the block of step S15 displays an example of the node group name for which the registration has been confirmed; in the illustrated example, "SCREEN 3" indicates that the user's node has been registered in the node group named "Rack1". With the screen display at step S15, it is possible to change the name (or group identification information) of the node group which the user's node belongs to, using the data entering operator TKY and the like. If the node group name (or group identification information) has ben changed, not only the node group name (or group identification information) stored in the storage section of the user's node is rewritten, but also data informing the change of the node group name (or group identification information) is transmitted via the communication network and control is performed for causing all the other nodes of the same group to rewrite the node group name (or group identification information) stored in their respective storage sections. Further, if setting/registration to the effect that the user's node belongs to the selected node group is to be performed with respect to a desired plug type or specific plug rather than the whole of the user's node, then a plug type or name of a specific plug to be made to belong to the selected node group is selected or designated, and information indicative of the designated type or name of the specific plug is stored in association with the node group name (or group identification information).

Figure 10:
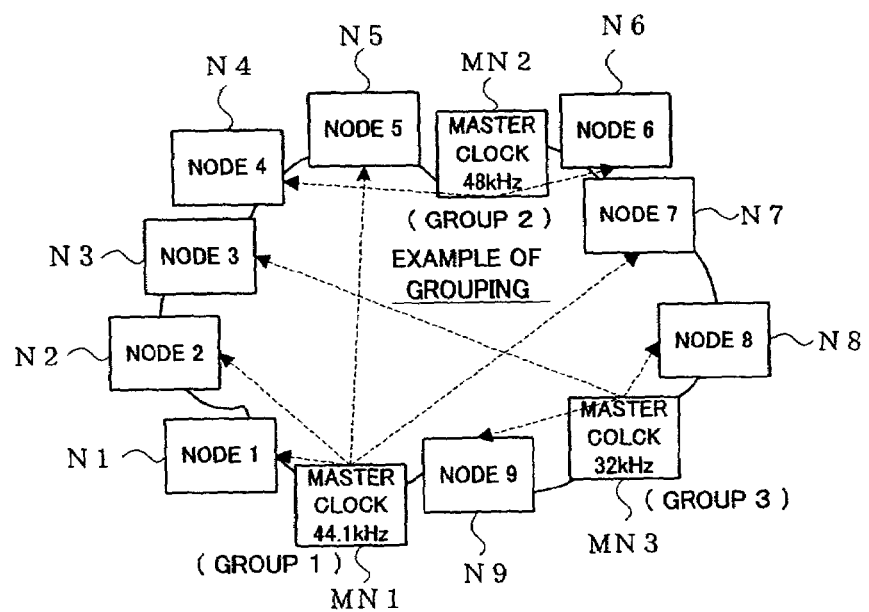
FIG. 10 is a diagram schematically showing examples of groups set or established on the communication network in accordance with an embodiment of the present invention.

In the above-described manner, the user of each of the nodes can select any of one or more node groups present on the communication network and add the user's node to the selected node group as a member of the group or change the node group which the user's node belongs to. Namely, in the instant embodiment, establishment of a node group on the communication network can be performed by the user of each of the nodes freely setting a node group to which the user's node should belong. Also, the user can freely change the name (nickname or ID) of the node group which the user's node belongs to. FIG. 10 schematically shows exemplary groups of the nodes on the communication network which have been set or established in the above-described manner. In the illustrated example, node groups are set or established such that the clock master node MN1 and nodes N1, N2, N5 and N7 belong to group 1 (provisional name selected for the description purpose), the clock master node MN2 and nodes N4 and N6 belong to group 2 (provisional name), and the clock master node MN3 and nodes N8 and N9 belong to group 3 (provisional name).

Further, in the instant embodiment, such node group establishment and management can be performed for each of the plug types or specific plugs belonging to the plug types as well as for each of the nodes as a whole. Mixer node (i.e., a node having an audio mixing function) is one example of such a node which can be registered as members of different node groups in accordance with the types of the plugs used. For example, in the mixer node, the "audio input" plug type may be registered in group 1 (provisional name), and the "audio output" plug type may be registered in group 2 (provisional name). In such a case, input/output settings can be made across different node groups such that audio signals of group 1 are input to the "audio input" of the mixer node and then output from the "audio output" of the mixer node to another node belonging to group 2. However, specific plugs belonging to a same plug type (e.g., "audio input 1-R", "audio input 1-L", "audio input 2-R" and "audio input 2-L") are classified into a same group.

On the other hand, a sampling converter node (i.e., a node functioning as a sampling frequency converter) is one example of such a node which is registered as members of different node groups in accordance with the specific plugs belonging to a same plug type. Let it be assumed here that group 1 (provisional name) includes a word clock master node of a 48 kHz master clock frequency (e.g., node MN2 of FIG. 1) and group 2 (provisional name) includes a word clock master node of a 44.1 kHz master clock frequency (e.g., node MN1 of FIG. 1). In the sampling converter node, the plug type "clock input" includes at least two specific plugs "clock input 1" and "clock input 2". It is also assumed here that the function of the sampling converter node is to convert a sampling frequency of an input audio signal of a clock frequency input via the "clock input 1" plug to another sampling frequency of an audio signal of another clock frequency input via the "clock input 2" plug. In this case, by setting the "clock input 1" plug to group 1 and the "clock input 2" plug to group 2 and setting the "audio output" plug type or specific plug belonging to the plug type to group 2, the sampling frequency of the audio signal having the 48 kHz sampling clock frequency input via the "audio input" plug can be converted into the sampling frequency of the 44.1 kHz clock frequency input via the "clock input 2" plug, and then the converted signal can be output via the "audio output" plug.

As understood from several specific examples described above, the node group setting or establishment may be performed either for each node, each plug type or each specific plug, or for any desired combination of the node, plug type and specific plug belonging to the plug type. For example, the whole of one given node may be set to belong to group 1 (provisional name), then a desired plug type included in the same node may be set belong to group 2 (provisional name) and then a desired specific plug included in the same node may be set belong to group 3 (provisional name), unless any particular contradiction results from such setting. In such a case, node groups which the node, plug type and specific plug included in the plug type should belong to may be determined in order of reverse hierarchy. Namely, each plug type or specific plug having been set to a particular node group (group 2 or 3) may be handled individually as a member of such a node group, while each of the other plug types and specific plugs may be handled as a member of a node group (group 1) which the whole of the node in question has been set to belong to.

The illustrated example of FIG. 7 is arranged to allow the user of any one of the networked nodes to select a desired node group and thereby determine which node group the user's node should belong to. This approach is suitable for the user to select any of one or more node groups currently existing on the communication network and add the user's node as a new constituent member of the selected node group or change the node group, to which the user's node belongs, over to another node group. If a new node group that has never existed before is to be set or established, it suffices to activate a new group establishing mode when the cursor points to a blank position right below the display of existing node group names, for example, at step S12 of FIG. 7. In such a new group establishing mode, arrangements may be made such that neither a node group name nor nodes belonging to the group is displayed on the screen shown at step S14 and the node group name display is blinked on the screen shown at step S15 to prompt the user to enter the name of the node group to be newly established. Once the name (group identification information) of the node group to be newly established is entered by the user, the entered name (group identification information) is stored into the storage section of the user's node, and the new node group is established in this way. In this case, only one node belongs to the newly-established node group at the very initial state, but the number of the node belonging to the new node group will increase each time similar predetermined operation is performed in another node for selecting the new node group.

In the present invention, however, the scheme for setting or establishing a node group may be other than the above-described. For example, a particular node having a managerial function, such as a personal computer, may perform the process for setting a node group. In such a node group setting process, a plurality of nodes that should belong to a given node group are selected from among the networked nodes in response to user's node-selecting input operation, and a group name (group identification information) of the given node group to be constituted by these selected nodes is imparted by user's input operation. Once the group setting procedures have been completed in this manner, the group name (group identification information) is informed, via the communication network, to each of the nodes constituting that node group and stored into the storage section of each of the nodes, and thereby the group setting/registration operations are completed. In this case, the organization of the node group can be changed/set by the particular node. Of course, the group setting process in the particular node may be carried out in association with the plug types and specific plugs included in the plug types, in a similar manner to the above-described. Such a group setting process in the particular node can coexist with the group setting process by an ordinary node, such as the process of FIG. 7. Namely, the states of the node group established by the particular node can be changed through the group setting process by the normal node as illustratively shown in FIG. 7.

Because each of the networked nodes in the instant embodiment is arranged to register or store the group identification information of the node group to which the node (or particular plug type or specific plug included in the plug type of the node) belongs, data communication can be appropriately controlled, using the group identification information, in the data communication via the serial bus. Namely, a transmitting node is arranged to include group identification information of the node in the header of a data packet to be sent to the serial bus, and a receiving node is arranged to determine whether the group identification information in the header of the data packet transmitted via the serial bus coincides with the group identification information stored in the storage section of the receiving node. If the two group identification information coincides with each other, the receiving node takes in the data packet; otherwise, the receiving node does not take in the data packet. In this way, there is no need for each of the nodes (receiving nodes) to preset data reception conditions as to from which node data should be received or should not be received. Thus, even in the case where combinations of the nodes communicating data with each other are changed, the present invention eliminates the need for each of the nodes to change, per change of the node combination, the individual settings about nodes from which to receive data, and it just suffices just change the settings about the node grouping. Namely, the present invention can freely change node-to-node connections on the communication network by only changing the registration of the node group (the settings about the node grouping). Further, the present invention allows the current node-to-node connections on the communication network to be readily identified by just checking the group identification information of the individual nodes.

The following paragraphs set forth some important points to be taken into account when setting or establishing a node group on a communication network that handles tone-related signals as described above.

For synchronization of a tone-related signal to be transmitted to the individual nodes on the communication network, a reference time stamp generated by the word clock master node is used, as well known in the art. For a single node group constituted by a plurality of nodes, only one such word clock master node will suffice. Among the networked nodes, there may be ones that can generate a master clock like a multi-function device such as a personal computer and ones that can not generate a master clock like a single-function device such as a mixer. Each one of the nodes capable of generating a master clock has a potentiality for becoming a word clock master node. Therefore, in the course of building a communication network, it is uncertain which node will become a word clock master node, and it is desirable to appropriately deal with this uncertainty. The scheme to be explained below is intended to prevent two or more mater clock nodes from redundantly existing within one node group in the process of building a communication network employing the concept of the node group classification.

Figure 8:
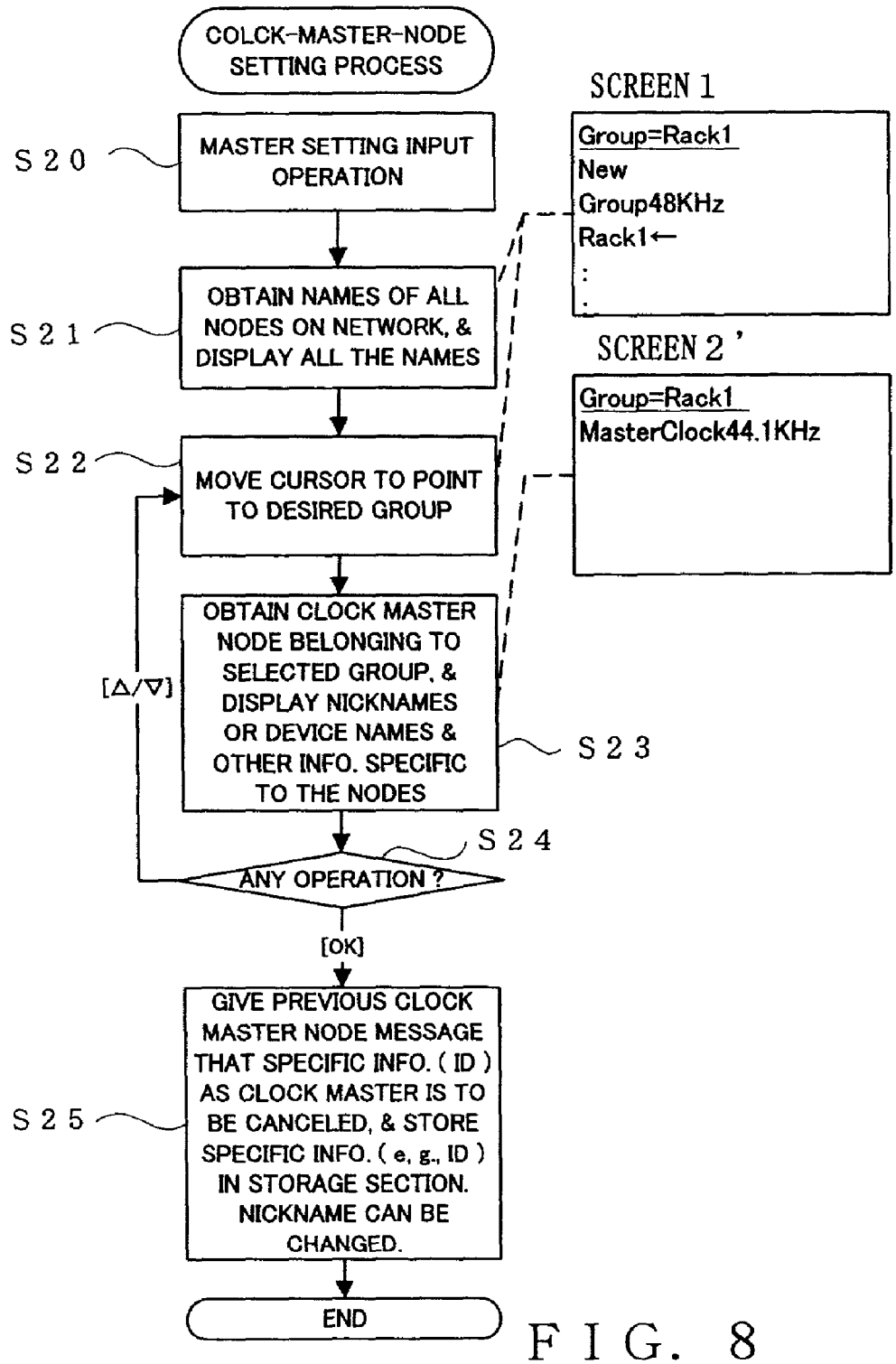
FIG. 8 is a flow chart explanatory of another embodiment of the present invention, which particularly shows an example of a clock-master-node setting process carried out in one of the nodes.

FIG. 8 is a flow chart showing an example step sequence of a clock-master-node setting process that can be carried out by a node having a potentiality for becoming a word clock master node. First, once predetermined master setting input operation is performed via the managing operator S1, the clock-master-node setting process is started up (step S20). Then, in a similar manner to step S11 of FIG. 7, the names of all node groups currently present on the communication network are obtained, and all of the thus-obtained node group names (a list of node group names) are displayed on the display section DPY, at step S21. "SCREEN 1" depicted to the right of the block of step S21 shows an example of the list of node group names displayed on the display section DPY.

Then, in a similar manner to step S12 of FIG. 7, the cursor is moved on the node group name screen of the display section DPY to point to and select a desired one of the displayed node groups, at step S22. Then, the selection by the cursor is confirmed by the user performing predetermined selection confirming operation, after which the routine goes to step S23. At step S23, the name (node ID) of a clock master node included in the single node group selected via the cursor is obtained and displayed on the display section DPY. "SCREEN 2" depicted to the right of the block of step S23 shows an exemplary display of the clock master node included in the single node group, where "MasterClock 44.1 kHz" is the name of the clock master node. Although not specifically shown in the exemplary display of "SCREEN 2'", there may be displayed here, in addition to the node's name, other pieces of information specific to the clock master node, such as the name of the device constituting that node.

At next step S24, a determination is made as to whether the confirming (OK) operator S4 has been operated on the operation panel to confirm the selection of the node group. If the confirming (OK) operator S4 has been operated as determined at step S24, the routine moves on to step S25, but if the screen-switching operator S2 has been operated, the routine reverts to step S22 to allow the user to select another node group via the group list display screen (SCREEN 1). At step S25, the group name (group identification information), whose selection has been confirmed, is stored into the predetermined storage section of the user's node. Also, at step S25, the fact that the user's node has become the clock master node in the node group is registered by storing, into the predetermined storage section, the information specific to the user's node as the clock master node. At the same time, another node which has so far been the clock master node (previous or last clock master node) in the node group is given, via the communication network, a message to the effect that the role of the other node as the clock master node is to be now canceled (revoked). In response to such a message, the other node which has so far possessed the name of "MasterClock 44.1 kHz" leaves the node group by deleting the group identification information of the node group and the specific information as the clock master node from the other node's storage section. In this way, the role of the clock master node in the node group is transferred to the node which has executed the clock-master-node setting process of FIG. 8. At step S25, the name (nickname) of the clock master node can be changed as necessary. However, even in such a case, the specific information (specific ID) representing the role as the clock master node never changes. Thus, each of the remaining nodes (slave nodes) belonging to the node group can carry out data transmission/reception processing without caring about or noticing the fact that there has taken place a changeover in the clock master node.

By thus performing control such that only one node of a particular function, i.e. only one clock master node, is allowed to exist in one node group, an operation for changing a setting change, such as one for changing the node of the particular function, i.e. the clock master node, from one node over to another can be carried out with ease. The node, having newly become the clock master node, communicates with any of the remaining nodes (slave nodes) on the communication network, using the predetermined name or specific ID indicating that the node is now the clock master node; for example, the node adds, to the header of a synchronization signal packet to be transmitted to the communication network, the specific ID indicating that the node is now the clock master node. Thus, each of the other nodes (slave nodes) on the communication network identifies the synchronization signal packet, transmitted from the communication network, to be data from the node group which the other node belongs to and receives the packet for subsequent processing, if the header of the synchronization signal packet is imparted with the group identification information of the node group and the ID indicative of the clock master node. Therefore, each of the slave nodes can perform necessary processing without having to specifically determining which one of the nodes is exactly the clock master node, which is very convenient.

Figure 9A:
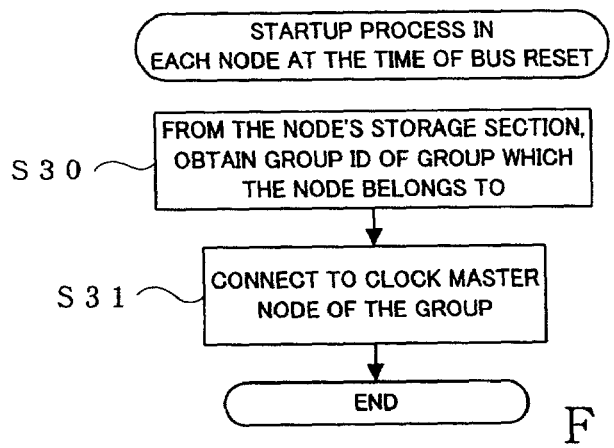
FIG. 9 is a flow chart showing an example of data transmission/reception processing executed via the communication network.

The following paragraphs briefly describe an example of data transmission/reception processing executed via the communication network, with reference to FIG. 9. Specifically, FIG. 9A is a flow chart of a startup process performed in each of the nodes at the time of a bus reset (i.e., process performed in each node in response to establishment of a communication network). Detailed operations in the startup process performed in each of the nodes in response to the establishment of the communication network may be similar to those disclosed, for example, in Japanese Patent No. 2,830,766, except for node-group-related operations. More specifically, FIG. 9A shows only the operations related to a node group. First, each of the nodes reads out, from its storage section, the group ID (group identification information) of the node group which the node belongs to, and identifies the node group, at step S30. The node group may be identified in any of various manners. For example, only the group identification information of the node group, to which the node in question belongs, may be prepared in readiness for impartment to the header of a data packet to be transmitted and also for comparison with the group identification information included in the header of a received packet. In this case, it is essential to impart the group identification information to the header of the data packet to be transmitted. Alternatively, in the operation of step S30 responsive to the establishment of the communication network, each of the nodes may obtain the respective group identification information from the other nodes and then generate, in its storage section, a list indicating which particular ones of the nodes (or plug types or specific plugs in such plug types) belong to the same node group as the node in question. In such a case, the nodes belonging to the same node group as the node in question can be identified with reference to the list, so that it is not essential to impart the group identification information to the header of the data packet be transmitted and it is only necessary to impart the node ID to the header of the data packet. However, in this case, there is a need to update the list each time the node group setting is changed.

At next step S31 of FIG. 9A, the node in question is connected to the clock master node in the node group to which it belongs, in readiness for receiving a synchronization signal packet from the clock master node. Namely, in this instance, both of transmitting and receiving nodes are arranged to receive the synchronized signal packet directly from the clock master node in the node group, on the basis of which processing in the individual nodes can be synchronized. Such arrangements can even further enhance the synchronizing accuracy. Note that the operation of step S31 is not necessary for those nodes which require no synchronized processing. Of course, for each node having the identifier (specific ID) indicating that it is the clock master node, the operation of step S31 may also be dispensed with.

Figure 9B:
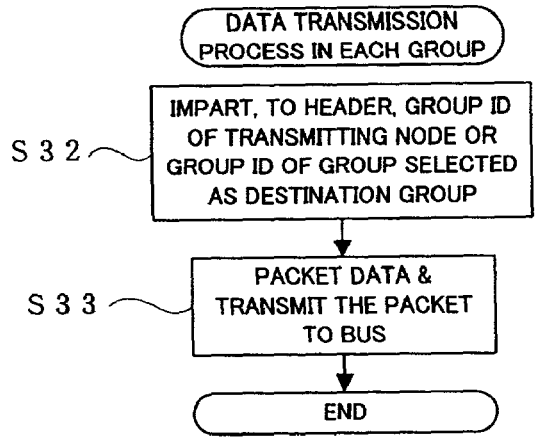
Figure 9C:
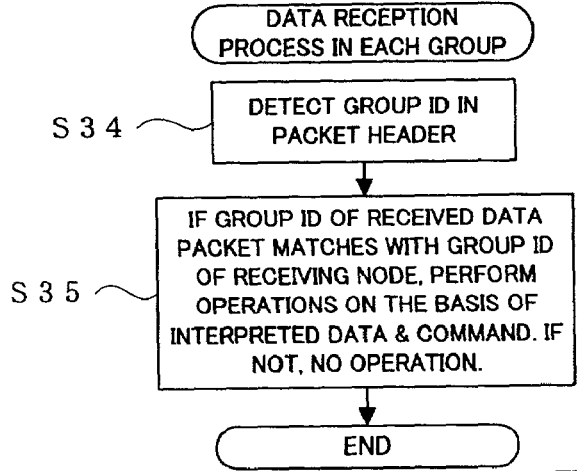

FIG. 9B is a flow chart showing an example of a data transmission process (i.e., process in a transmitting node) using the group identification information. FIG. 9C is a flow chart showing an example of a data reception process (i.e., process in a receiving node) using the group identification information. In the transmitting node, the group identification information (group ID) of the node group to which the transmitting node belongs is imparted to the header of data to be transmitted, at step S32. Then, the header and substantive data portion are combined together into a packet and transmitted to the serial bus at step S33. The group identification information (group ID) to be added to the header may be the group identification information (group ID) of a node group (or node groups) by which the data is to be received (desired destination node group). In such a case, one or more node groups are selected as a destination of the data and the group identification information (group ID) of the thus-selected node groups is imparted to the header at step S32. Each of the receiving nodes detects the group identification information (group ID) included in the header of the packet received from the serial bus, at step S34. Then, if the group identification information (group ID) of the received packet matches with the group identification information (group ID) of the receiving node, the packet is taken into the receiving node and depacketed, after which the data or command is interpreted and necessary operations are carried out on the basis of the thus-interpreted data or command (step S35). In case the group identification information (group ID) of the received packet does not match with the group identification information (group ID) of the receiving node, no particular operation is carried out. By using the group identification information as set forth above, it is possible to deal with, in a user-friendly way, the data communication among the nodes logically connected with one another in a complicated fashion. Further, by the use of the group identification information, it is possible to readily perform real-time communication of data and commands by extracting only a plurality of necessary nodes.

As having been described above, the present invention is characterized in that one or more nodes are selected from among a plurality of networked nodes and classified as a node group and each of these nodes registers group identification information of the node group in such a manner that the nodes constituting a same data communicating group can be identified from the group identification information. With such arrangements, just checking the group identification information of each of the nodes can ascertain which nodes are actually connected with which nodes (actual data communicating relations among the nodes) and hence actual connecting states among the nodes. Further, by just changing a node group, to which a given node belongs, over to another, it is possible for the given node to establish connection with all nodes present in the other node group. As a result, the present invention can readily set actual connecting states between a plurality of nodes and change contents of the thus-set connecting states as necessary.

Further, by performing control such that only one node of a particular function, such as a word clock master node, exists in one node group, the present invention can readily perform an operation for changing, such as one for changing the node of the particular function from one node to another. For example, the node of the particular function can be appropriately changed from one node to another, without having to reclassify (rearrange the classification of) the nodes into node groups. Thus, with the present invention, the setting about the node of the particular function, such as a word clock master node, can be changed with ease. Further, even when a changeover has taken place in the node of the particular function, such as a word clock master node, the present invention allows the node newly allocated the particular function to communicate with another node by use of the identification information or name specific to the particular function, so that the other node always only has to identify the node of the particular function using the specific identification information or name without caring about or noticing the changeover. As a result, the present invention allows the setting about the node of the particular function, such as a word clock master node, to be changed with increased ease.

What is claimed is:

1. A communication system having a communication network and a plurality of nodes connected to the communication network and in which audio data are transferred between the plurality of nodes with respective sampling clocks of the plurality of nodes synchronized via a synchronization signal packet, said communication system comprising:
   a grouping section that groups said plurality of nodes into a plurality of groups; and
   a master setting section that sets, for each of the groups, one of the nodes within the group as a clock master node, wherein the clock master node in each of the groups sends a synchronization signal packet to the communication network after attaching, to the synchronization signal packet, identification information indicative of the group to which the master clock node belongs and an ID indicating itself as the clock master node of the group, and
   wherein each of said plurality of nodes that is not set as the clock master node receives, from among a plurality of the synchronization signal packets sent to the communication network, a synchronization signal packet having identification information indicative of the group to which the node belongs and the ID indicative of the clock master node of the group to which the node belongs and performs a synchronization process on the sampling clock thereof on the basis of the received synchronization signal packet.

2. A communication system as claimed in claim 1, further comprising a designation section that, in response to confirming operation by a user, designates one of said plurality of nodes as a clock master node of a particular one of the groups, wherein, in response to designation by said designation section, said master setting section cancels a clock master setting of the node that has been previously set as the clock master node of the particular group and sets the designated node as a new clock master node of the particular group.

3. A communication control apparatus for inclusion in a given one of a plurality of nodes connected to a communication network in a communication system in which audio data are transferred between the plurality of nodes with respective sampling clocks of the plurality of nodes synchronized via a synchronization signal packet transmitted by any one of the plurality of nodes set as a clock master node, the plurality of nodes being grouped into a plurality of node groups, said communication control apparatus comprising:
   a storage section that stores group identification information of the group to which the given node belongs;
   a synchronization signal packet reception section that receives the synchronization signal packet via the communication network, the synchronization signal packet, transmitted via the communication network, having attached thereto group identification information indicative of the group of each individual node that should receive the synchronization signal packet, said synchronization signal packet reception section selectively receiving the synchronization signal packet transmitted via the communication network on condition that the group identification information attached thereto matches with the group identification information stored in said storage section; and
   a synchronization section that performs a synchronization process on the sampling clock of the given node on the basis of the synchronization signal packet received via said synchronization signal packet reception section.

4. A communication control apparatus for inclusion in a given one of a plurality of nodes connected to a communication network in a communication system in which audio data are transferred between the plurality of nodes with respective sampling clocks of the plurality of nodes synchronized via a synchronization signal packet transmitted by any one of the plurality of nodes set as a clock master node, the plurality of nodes being grouped into a plurality of node groups, said communication control apparatus comprising:
   a designation section that designates the given node as a clock master node of a particular one of the groups to which the given node belongs;
   a cancellation section that, in response to designation by said designation section, transmits an instruction to another one of the nodes, which has been previously set as the clock master node of the particular group, for canceling a role of the other node as the clock master node;
   a setting section that, in response to designation by said designation section, sets the given node as the new clock master node of the particular group; and
   a synchronization signal packet transmission section that, when the given node is set as the new clock master node of the particular group, generates the synchronization signal packet with group identification information indicative of the particular group attached thereto and transmits the generated synchronization signal packet via the communication network,
   wherein each of said plurality of nodes selectively receives the synchronization signal packet of the group to which the node belongs on the basis of the group identification information attached to the synchronization signal packet, and then performs synchronization of the sampling clock thereof on the basis of the received synchronization signal packet.

5. A communication control method for execution in a communication system having a communication network and a plurality of nodes connected to the communication network and in which audio data are transferred between the plurality of nodes with respective sampling clocks of the plurality of nodes synchronized via a synchronization signal packet, said plurality of nodes being grouped into a plurality of groups, said method comprising:
   a step of setting, for each of the groups, one of the nodes as a clock master node;
   a step of causing the one node set as the clock master node in each of the groups to send a synchronization signal packet to the communication network after attaching, to the synchronization signal packet, identification information indicative of the group to which the one node belongs and an ID indicating itself as the clock master node of the group, and a step of causing each node that is not set as the clock master node to receive, from among a plurality of the synchronization signal packets sent to the communication network, a particular synchronization signal packet having the identification information indicative of the group to which the node belongs and the ID indicative of the clock master node of the group to which the node belongs, and performs a synchronization process on the sampling clock thereof on the basis of the received synchronization signal packet.

6. A computer program comprising computer program code means for performing all the steps of claim 5 when said program is run on a computer.

7. A communication control method for execution in a given one of a plurality of nodes connected to a communication network in a communication system in which audio data are transferred between the plurality of nodes with respective sampling clocks of the plurality of nodes synchronized via a synchronization signal packet transmitted by any one of the plurality of nodes set as a clock master node, the plurality of nodes being grouped into a plurality of node groups, said communication control method comprising:

a step of storing, in a memory, group identification information of the group to which the given node belongs;

a step of receiving the synchronization signal packet via the communication network, the synchronization signal packet, transmitted via the communication network, having attached thereto group identification information, said step of receiving selectively receives the synchronization signal packet transmitted via the communication network on condition that the group identification information attached thereto matches with the group identification information stored in the memory; and a step of performing a synchronization process on the sampling clock of the given node on the basis of the synchronization signal packet received via said step of receiving.

8. A computer program comprising computer program code means for performing all the steps of claim 7 when said program is run on a computer.

9. A communication control method for execution in a given one of a plurality of nodes connected to a communication network in a communication system in which audio data are transferred between the plurality of nodes with respective sampling clocks of the plurality of nodes synchronized via a synchronization signal packet transmitted by any one of the plurality of nodes set as a clock master node, the plurality of nodes being grouped into a plurality of node groups, said communication control method comprising:

a step of designating the given node as a clock master node of a particular one of the groups to which the given node belongs;

a step of, in response to designation by said step of designating, transmitting an instruction to another one of the nodes, which has been previously set as the clock master node of the particular group, to cancel the role of the other node as the clock master node;

a step of, in response to designation by said step of designating, setting the given node as the new clock master node of the particular group; and a step of, when the given node is set as the clock master node of the particular group, generating the synchronization signal packet with group identification information indicative of the particular group attached thereto and transmitting the generated synchronization signal packet via the communication network, wherein each of said plurality of nodes selectively receives the synchronization signal packet of the group to which the node belongs on the basis of the group identification information attached to the synchronization signal packet, and then performs synchronization of the sampling clock thereof on the basis of the received synchronization signal packet.

10. A computer program comprising computer program code means for performing all the steps of claim 9 when said program is run on a computer.

* * * * *